Oct. 6, 1970 J. OLLENDORF ET AL 3,532,944

SEMICONDUCTOR DEVICES HAVING SOLDERED JOINTS

Filed Nov. 4, 1966

INVENTORS
Joel Ollendorf &
Frederick P. Jones
BY M. Y. Epstein
Attorney

United States Patent Office 3,532,944

Patented Oct. 6, 1970

3,532,944

SEMICONDUCTOR DEVICES HAVING SOLDERED JOINTS

Joel Ollendorf, Springfield, and Frederick P. Jones, Neshanic Station, N.J., assignors to RCA Corporation, a corporation of Delaware Filed Nov. 4, 1966, Ser. No. 592,121
Int. Cl. H01l 5/02
U.S. Cl. 317—234 2 Claims This invention relates to semiconductor devices and particularly to semiconductor devices of large size, e.g., power output types.

In certain types of semiconductor devices composed of relatively large members, e.g., power output transistors, it is the practice to mount, as by means of a solder joint, a member, such as semiconductor pellet or an electrode of a pellet, to another member, such as a heat conductive substrate. In the operation of such devices, heat produced in the pellet is dissipated by conduction through the solder joint and into the substrate. To this end, it is desirable that the solder joint have a high thermal conductance. Also, to avoid hot spots in the pellet, it is desirable that the solder joint have a uniform thermal conductance.

A problem in the past has been the difficulty of providing solder joints having uniform and high thermal conductance. Specifically, it is found that during the formation of such solder joints, gases are trapped in the molten solder and give rise to gas pockets or holes in the joint. The gas pockets lower the thermal conductance of the joints.

Another object of this invention is to provide improved semiconductor devices of the type described.

A further object of this invention is to provide novel means for obtaining hole-free solder joints between members of semiconductor devices.

For achieving these objects in, for example, a semiconductor device having a flat semiconductor pellet, the substrate on which the pellet is mounted is provided with a convex surface. Solder is disposed between the pellet and the convex surface, and the assembly is heated to melt the solder. Owing to the convexity of the substrate surface, a single discrete spot or surface portion of the pellet is closer to the substrate than all other surface portions of the pellet. As the solder melts, the molten solder first wets (that is, makes an "adherent contact" with) the pellet and the substrate at the spot referred to, and the wet spot thereafter grows outwardly in size until the remainder of the pellet and the surface of the substrate thereunder are completely wet by the solder. The outward growth of the wet area from a single spot drives the ambient gases before the "wetting front," whereby entrapment of the gases is avoided, and a solid, hole-free solder joint is formed.

Figure 1:
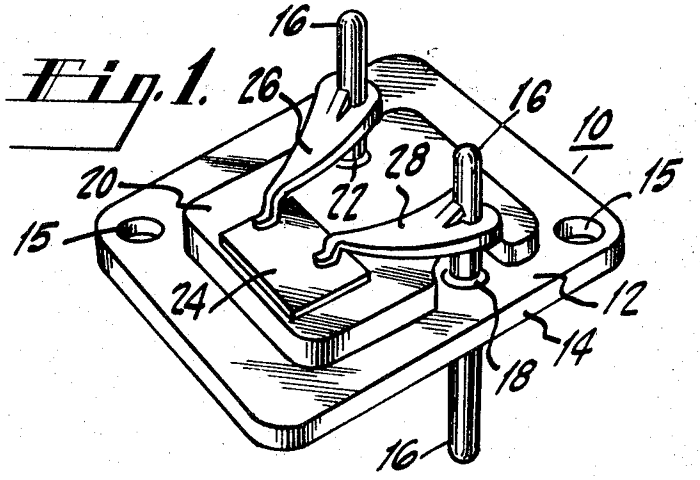
FIG. 1 is a view in perspective of an illustrative transistor mount.

With reference to FIG. 1, a transistor mount 10 of a type in which the present invention has utility is shown. The mount 10 comprises a stem 12 including a header 14 having two mounting openings 15 therethrough, and two leads 16 hermetically sealed through the header 14 by means of annular glass seals 18. Mounted on the header 14 is a block or heat sink 20. Mounted on the heat sink 20 by a solder joint is a flat semiconductor pellet 24 having regions of P and N type conductivity, and bonding pads (not shown) electrically connected to the different conductivity regions. Details of the pellet 24 are not shown since such pellets are known. Also, in some instances, not shown, the "pellet" conprises a block of semiconductor material having a flat conductive electrode bonded thereto, the electrode being soldered to the heat sink 20. Two contacts 26 and 28 extend between and are electrically bonded to each lead 16 and a different bonding pad on the pellet 24.

Although not shown, a complete transistor is provided by hermetically enclosing the mount 10 in a known type of enclosure or can. The illustrative transistor is a power output transistor such as RCA type 2N3055.

Figures 2, 3, 4, 5:
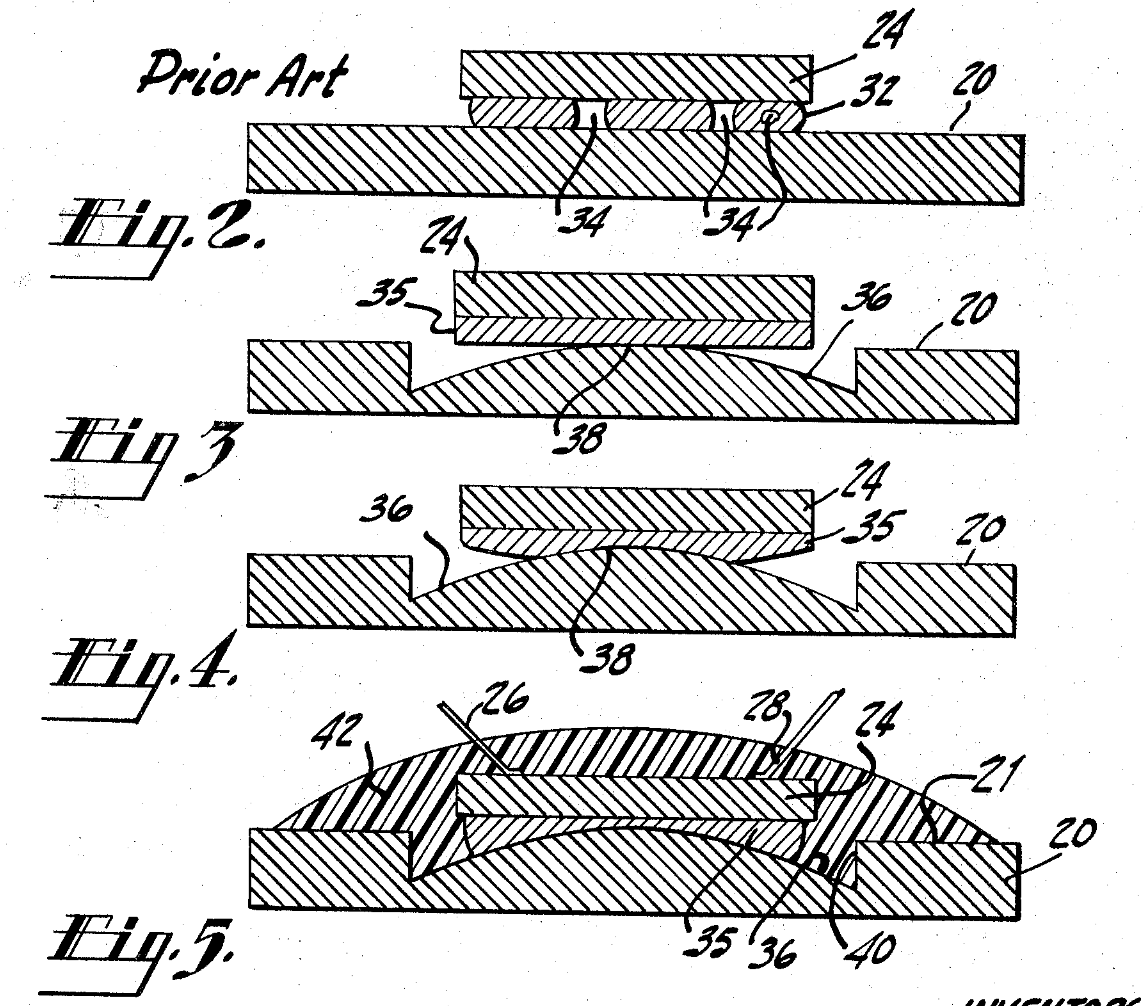
FIG. 2 is a section, on an enlarged scale, of a prior art joint used in the mount shown in FIG. 1.
FIGS. 3, 4, and 5 are views similar to FIG. 2 but showing successive steps in the formation of a joint according to the present invention.

With reference to FIG. 2, a prior art joint 32 between a flat pellet 24 and a flat heat sink 20 is shown. The joint 32, as shown, is not completely solid but has pockets 34 of entrapped gases therein. The gases are relatively poor conductors of heat, hence the thermal conductance of the joint 32 is non-uniform and is somewhat less than the thermal conductance of the solder material itself.

The presence of such gas pockets, it is found, is somewhat dependent upon the size of the members being joined. For a small pellet 24, for example, having an area less than about 0.0016 square inch, solid and hole-free joints are generally readily obtained. For larger members, the avoidance of such holes has been a longstanding problem. Type 2N3055, for example, uses a pellet 24 having an area of about 0.033 square inch, and it has not been known, heretofore, how to provide hole-free, solid solder joints between the pellet and its substrate.

Although not fully understood, it appears that in the formation of a solder joint, the molten solder initially "wets" a first surface area or areas of the members being joined, and thereafter wets the remainder of the surfaces of the members by outward growth of the initial wet area. By "wets" is meant an "intimate" and "adhering" type contacting of the solder with the members. The portions of the members first wet and joined by the solder, it appears, are those portions of the members which are closest to one another.

With the flat pellet 24 and flat substrate 20 shown in FIG. 2, the normal surface irregularities of these members provide a number of randomly spaced spots or surface portions which are more closely spaced to one another than are other opposed surface portions of the members. Thus, upon melting of the solder during the soldering operation, the molten solder simultaneously wets the pellet and substrate at each of the several portions of closest spacing. Upon subsequent spreading of the areas of the pellet and substrate wet by the molten solder, ambient gases between the initially wet areas are entrapped between the expanding areas and produce gas pockets in the finished joint.

For avoiding entrapment of ambient gases, the members of the improved device to be joined, e.g., the pellets or electrodes of the pellets and the heat sink 20, are provided with nonconforming surfaces which provide a single, discrete spot or surface portion of closest spacing. For example, with a flat pellet 24, as shown in FIG. 3, having a cladding 35 of solder thereon, the substate 20 is provided with a convex surface 36. By "convex" is meant a generally upwardly curved surface, such as a spherical or cylindrical surface. In one embodiment, the convex surface 36 is formed by a coining process using a concave punch.

Owing to the convex surface 36, a single spot or surface portion 38 of the convex surface 36 is closer to the pellet 24 than all other surface portions of the surface 36. With a cylindrical surface, an elongated surface portion of closest spacing is provided. Thus, as the solder 35 melts, wetting of both the pellet and the surface 36 occurs initially only at the single surface portion 38, and the subsequent spread of the wet areas of the pellet and substrate proceeds outwardly (as shown in FIG. 4) from the one portion. The outwardly spreading wet area drives the ambient gases before it, whereby no gases are entrapped by the solder, and a solid, hole-free joint is formed.

In one embodiment, the solder used is 99% lead and 1% tin, by weight, and is provided as a 1 to 1½ mil cladding on the pellet. The soldering is performed at a temperature of 400° C.

The molten solder spreads both by its own weight and by capillary action, and the solder bridges or fills the space between the pellet and the convex surface provided the space therebetween does not exceed a certain distance determined by the surface tension of the solder, the materials of the pellet and substrate, and the temperature used. With a pallet 24 of silicon, a heat sink 20 of copper, a 99% lead, 1% tin solder, and a pellet having an area of 0.025 square inch, a radius of curvature of the convex substrate surface 36 of 1.6 inch has been found satisfactory.

A further advantage of the embodiment shown, wherein the surface 36 is provided by a coining means, is that the edge of the surface 36 is depressed below the surface 21 of the remainder of the substrate 20, a ledge 40 (FIG. 5) thereby being produced. After the mount 10 is assembled, known practice is to provide a sealing compound 42 over the pellet to encapsulate the pellet and to stabilize its surface. The ledge 40 restrains the flow of encapsulant, thus permitting a relatively thick layer to be applied over the pellet. It has been discovered that this increased thickness of encapsulant increases the collector-to-base voltage breakdown of the transistor and improves the stability of the voltage breakdown.

What is claimed is:

1. A semiconductor device having a semiconductor pellet soldered in heat conducting relationship to a heat conducting substrate, the soldered surface of said pellet being substantially flat, and the entire soldered surface of said substrate being convex, there being a variable spacing and a sole area of minimum spacing between said pellet flat surface and said convex substrate surface.

2. A semiconductor device as in claim 1 wherein said convex surface is at least partially depressed below a surrounding surface of said substrate, said surrounding surface being substantially parallel to said pellet, said convex surface having an area greater than the area of said pellet, and a sealing compound encapsulating said pellet and extending into said depressed portion of said convex surface.

References Cited

UNITED STATES PATENTS

| | | | |
|---|---|---|---|
| 2,668,262 | 2/1954 | Dunlap | 317—234 |
| 2,728,881 | 12/1955 | Jacobi | 317—235 |
| 2,903,628 | 9/1959 | Giacoletto | 317—234 |
| 2,999,194 | 9/1961 | Boswell et al. | 317—234 |
| 3,092,725 | 6/1963 | Grimmeiss et al. | 250—212 |
| 3,242,393 | 3/1966 | Pauli | 317—234 |
| 3,378,736 | 4/1968 | Vale et al. | 317—234 |

JOHN W. HUCKERT, Primary Examiner

B. ESTRIN, Assistant Examiner

U.S. Cl. X.R.

317—235